United States Patent [19]

Mendenhall et al.

[11] 4,200,845

[45] Apr. 29, 1980

[54] PHASE COMPARATOR WITH DUAL PHASE DETECTORS

[75] Inventors: Charles E. Mendenhall, Campbell; Randall L. Sandusky, San Jose, both of Calif.

[73] Assignee: Sperry Rand Corporation, New York, N.Y.

[21] Appl. No.: 972,571

[22] Filed: Dec. 22, 1978

[51] Int. Cl.² .......................... H03B 3/04; H03K 1/17; H03K 5/20
[52] U.S. Cl. ........................ 331/1 A; 307/232; 328/133; 328/155; 331/11; 331/14; 331/27
[58] Field of Search .......................... 331/1 A, 10–12, 331/14, 25, 27; 328/133, 134, 155; 307/232

[56] References Cited

U.S. PATENT DOCUMENTS

| | | | |
|---|---|---|---|
| 3,944,940 | 3/1976 | Desai | 331/11 X |
| 4,069,462 | 1/1978 | Dunn | 331/11 |
| 4,080,576 | 3/1978 | Huber et al. | 328/155 |

*Primary Examiner*—Siegfried H. Grimm
*Attorney, Agent, or Firm*—Thomas Schneck, Jr.; Eugene T. Battjer; William E. Cleaver

[57] ABSTRACT

A phase comparator for a digital phase locked loop which provides first and second order error signals for phase and frequency correction of a voltage controlled oscillator in the loop with respect to data being read for self synchronization of the data. A first order error signal is generated in a first phase detector which operates only during a VCO "unsafe" condition, i.e., when a data pulse is beyond a present limit. A finer, second order error signal is generated in a second phase detector which operates only during a VCO "safe" condition, i.e., when a data pulse is within a preset limit.

8 Claims, 2 Drawing Figures

PHASE COMPARATOR WITH DUAL PHASE DETECTORS

BACKGROUND OF THE INVENTION a. Field of the Invention

The invention relates to phase locked loops, and more particularly to phase comparators used in phase locked loops for reading recorded digital data.

b. Prior Art

In certain digital data recording and playback or reading schemes, the presence or absence of a signal, during a specified time period represents a data bit. Data encoding schemes such as FM and MFM, usually used in magnetic disk recording, rely on reading data by detecting pulses indicative of high-to-low or low-to-high transitions of encoded data during precisely timed intervals or bit cells. For example, ones may be represented by transitions in the center of a bit cell and zeroes may be represented by transitions at the leading boundary of a cell, except where a zero follows a one, in which case no transition is made. Thus, bit cell centers and boundaries must be known as precisely as possible. These bit cells may be defined by clocks external to the data being read, or may be defined by the data itself, or by clocking signals interspersed with the data.

In the latter situation timing signals have been supplied in the prior art by an oscillator in a phase locked loop whereby the oscillator, running at the highest encoding harmonic frequency, is synchronized to the data by the data itself. If, for example, the data encoding frequencies were $0.5f_o$, $0.067f_o$ and $f_o$ a voltage controlled oscillator, VCO, in a phase locked loop is locked in frequency to the harmonic frequency, $f_o$ in this example, with the phase of the VCO waveforms having an electronically defined relation to the data, for example, by defining a "window" during which an interrogation for a data signal is made.

For purposes of providing noise immunity it is known that a VCO can be designed to put out a masking signal which provides an indication of when the VCO is "safe" and "unsafe" for synchronization. For example, when the VCO output approaches a zero crossing, it is a convenient or safe time for synchronization since zero crossings are easy to detect. The remaining time may be regarded as unsafe. Moreover, associated read systems circuits may require that the VCO not be disturbed except during a predetermined safe interval during a VCO cycle. The present invention deals with phase locked loops in which the VCO has such a masking signal associated with it.

When a system is reading data, signal loss or drop-out is sometimes experienced because of recording errors, defects in the recording medium or the data transmission path or perhaps other causes. In any event, temporary loss of the data signal usually causes loss of synchronization between the local oscillator and the data signal, on its return. In those playback systems having synchronization data, sometimes known as preamble portions recorded with the data, recourse may be had to such preamble for re-establishing synchronization. However, it is desirable to re-establish or initially establish synchronization without recourse to a specially recorded data preamble.

In U.S. Pat. No. 4,080,576, Huber et al. teach use of a phase detector which operates in a non-harmonic mode for tracking preamble data pulses at a lower, non-harmonic frequency for initial lock-on and then switches operation to a harmonic mode for tracking non-preamble data pulses at a higher, harmonic frequency.

An object of the present invention is to provide a circuit for synchronizing a local oscillator with incoming data pulses for reading the data pulses without recourse to preamble data. Another object is to provide such a circuit with improved noise immunity.

SUMMARY OF THE INVENTION

The above objects have been achieved in a new phase comparator used in a digital phase locked loop for reading digital data. The phase comparator includes a first phase detector means for producing first order approximation error signals for increasing and decreasing the frequency of a VCO in the phase locked loop upon timewise overlap of a VCO feedback cyclic high or low signal and a data signal. This first phase detector operates only during the VCO unsafe condition once overlap occurs. A second phase detector means is provided for producing second order approximation error signals which are used for increasing and decreasing the VCO frequency during the VCO safe condition, providing overlap occurs.

In the first phase detector, the frequency of the feedback signal may be divided to magnify the duration of a positive or negative error signal during the unsafe condition for faster lock on. However, as soon as a VCO safe condition occurs the second phase detector comes into operation and uses an undivided feedback signal which provides milder VCO correction.

Both phase detectors are activated by a logic means, including a sync detector which detects timewise overlap between data and a cyclic VCO feedback signal and receives a VCO masking signal indicating a VCO safe or unsafe condition. During a VCO unsafe condition the logic means energizes only the first phase detector, while during the VCO unsafe condition only the second phase detector is energized. Both phase detectors have common outputs for increasing or decreasing the VCO frequency.

DESCRIPTION OF THE PREFERRED EMBODIMENT

A phase locked loop, PLL, typically, consists of a phase comparator connected to a voltage controlled oscillator along two paths. In one path the phase comparator transmits incoming signals to the VCO which responds with an output signal. In another path, the VCO output is tapped and fed back to the phase comparator for comparison with the incoming signal. The phase comparator responds with an error signal used to adjust the phase and frequency of a VCO. This description of a PLL is simplified to its essential elements. Other circuit functions may be interposed in a PLL, but it every case a VCO communicates with a phase comparator. The present invention deals with a new phase comparator.

Figure 1:
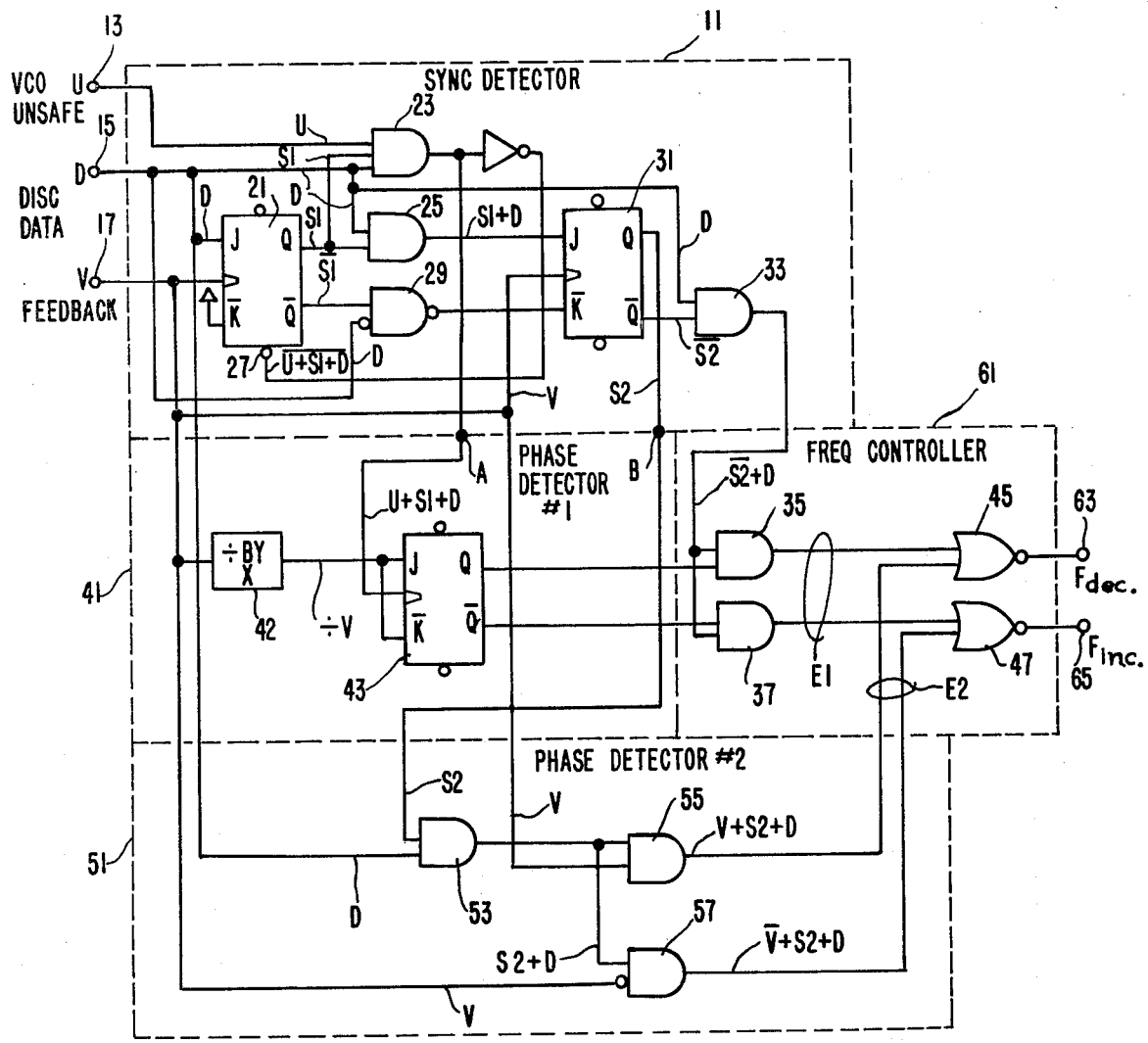
FIG. 1 is an electrical schematic of the phase comparator of the present invention.

With reference to FIG. 1, a sync detector, included within the dashed line 11, is provided to receive pulses electronically defining VCO safe and unsafe condition at the terminal 13. This pulse train is designated by the letter U. The sync detector 11 also receives discriminated data from a record medium at terminal 15 indicated by the letter D, while a cyclic VCO feedback signal, designated by the letter V, is delivered at the terminal 17. Illustrative waveforms will be seen in FIG. 2.

A first flip-flop 21 is of the J- $\overline{K}$ type, receiving data pulses D at the J input. These pulses are clocked by VCO feedback high pulses V, while the $\overline{K}$ input is grounded. This makes the flip-flop 21 indicate timewise overlap between data and VCO feedback high pulses. Overlap with VCO feedback high pulses is arbitrary; lows could alternatively be used. When such overlap occurs a "high" appears at the Q output of the flip-flop and a "low" at the $\overline{Q}$ output. The output signal of flip-flop 21 is designated S1. The S1 output is transmitted to AND gates 23 and 25. At AND gate 23 the S1 signal is combined with the VCO unsafe signal U, as well as the discriminated data signal D, then inverted prior to transmission to the "clear" terminal 27 of flip-flop 21. In other words, the S1 output of flip-flop 21 will cause the flipflop to be reset if it occurs during an unsafe condition, or an unsafe condition subsequently occurs.

The S1 output is transmitted through AND gate 25 on the next data pulse and appears at the J input of a J-$\overline{K}$ flip-flop 31 if flip-flop 21 is not cleared. The Q output of flip-flop 31 will go high when the output of AND gate 25 is clocked at flip-flop 31 by a feedback signal, V. The $\overline{K}$ input to flip-flop 31 receives the same input as the J input, but inverted. This requires the Q output of flip-flop 31 to go high when triggered by a high at the J input and go low when triggered by a low at the J input.

Sync detector 11 has two outputs, a first output at node A which is derived from AND gate 23 and is a synchronization signal containing S1, while a second output appears at node B containing a second synchronization signal S2 derived from the flip-flop 31. Note that a S2 signal cannot occur until there has been timewise overlap between D and V pulses in two consecutive cycles. A further proviso for the occurance of a S2 signal is that a VCO safe condition occur so that flip-flop 21 is not reset. The complimentary output at the $\overline{Q}$ terminal of flip-flop 31 is transmitted to AND gate 33 for combination with the data pulses D and transmittal to the AND gates 35, 37.

The first phase detector, enclosed in dashed line 41 has a principal component consisting of a J- $\overline{K}$ flip-flop 43 which receives at its J input the VCO feedback signal divided by a number. The divider number of the divider circuit 42 is selected so that the divided VCO signal has a frequency at least as low as a non-harmonic data rate would be. For example, in the case of MFM encoding mentioned previously using frequencies $0.5f_o$, $0.67f_o$ and $f_o$, the non-harmonic rate would be $0.5f_o$. That signal is clocked by the input from sync detector 11 which appears at node A. The output of flip-flop 43 at the Q terminal is transmitted to AND gate 35, while the $\overline{Q}$ output is transmitted to AND gate 37. The divided VCO input to flip-flop 43 may be considered a relatively wideband signal for lock-on purposes because any S1 output from sync detector 11 at node A will cause a high level output signal at either the Q or $\overline{Q}$ output of flip-flop 43. This is a first order approximation error signal for increasing or decreasing the VCO frequency which is transmitted through the AND gates 35 and 37 to the OR gates 45 and 47. Any S1 signal occurring during an unsafe condition of the VCO must necessarily cause a Q or $\overline{Q}$ output of flip-flop 43 thereby forcing a VCO frequency increase or decrease. This correction is applied without the need of a non-harmonic data signal. Ordinary harmonic data signals are used and appear in the clocking input to flip-flop 43 derived from node A. This is in contrast to the prior art, where resort was had to non-harmonic data pulses occurring in the data preamble.

A second phase detector, enclosed in the dashed line 51 has an AND gate 53 which receives as an input the output signal from node B of the sync detector 11. This output is the S2 signal from flip-flop 31 and is clocked through the AND gate 53 by data pulses, D, arriving from input terminal 15. The output of AND gate 53 is transmitted to AND gates 55 and 57 where the output is combined with VCO feedback signal, V. AND gate 57 has an inverting input for the V clocking signal. The outpt of AND gate 55 is connected to an input of OR gate 45, while the output of AND gate 57 is connected to the input of OR gate 47. The output of OR gate 45 is used to decrease the VCO frequency, while the output of OR gate 47 is used to increase the VCO frequency. The outputs of AND gates 55 and 57 contain an S2 component which occurs only during a VCO safe condition and is clocked during timewise overlap between a VCO feedback signal and a data pulse. This provides for relatively fine adjustment of the VCO frequency. The clocking provided by the feedback signal, V is at a higher frequency than the divided VCO signal fed to the first phase detector 41 from node A. The implication is that the second phase detector provides a relatively narrow band error signal which is a second order approximation error signal, derived only after having achieved a first order approximation error signal.

The OR gates 45 and 47 are part of a frequency controller, included within the dashed line 61. The frequency controller 61 has outputs 63, 65 which are connected to a network which decreases and increases the VCO frequency. Pulses taken at terminal 63 are utilized for providing a VCO frequency decrease, while pulses taken from output 65 are used for providing a frequency increase.

Figure 2:
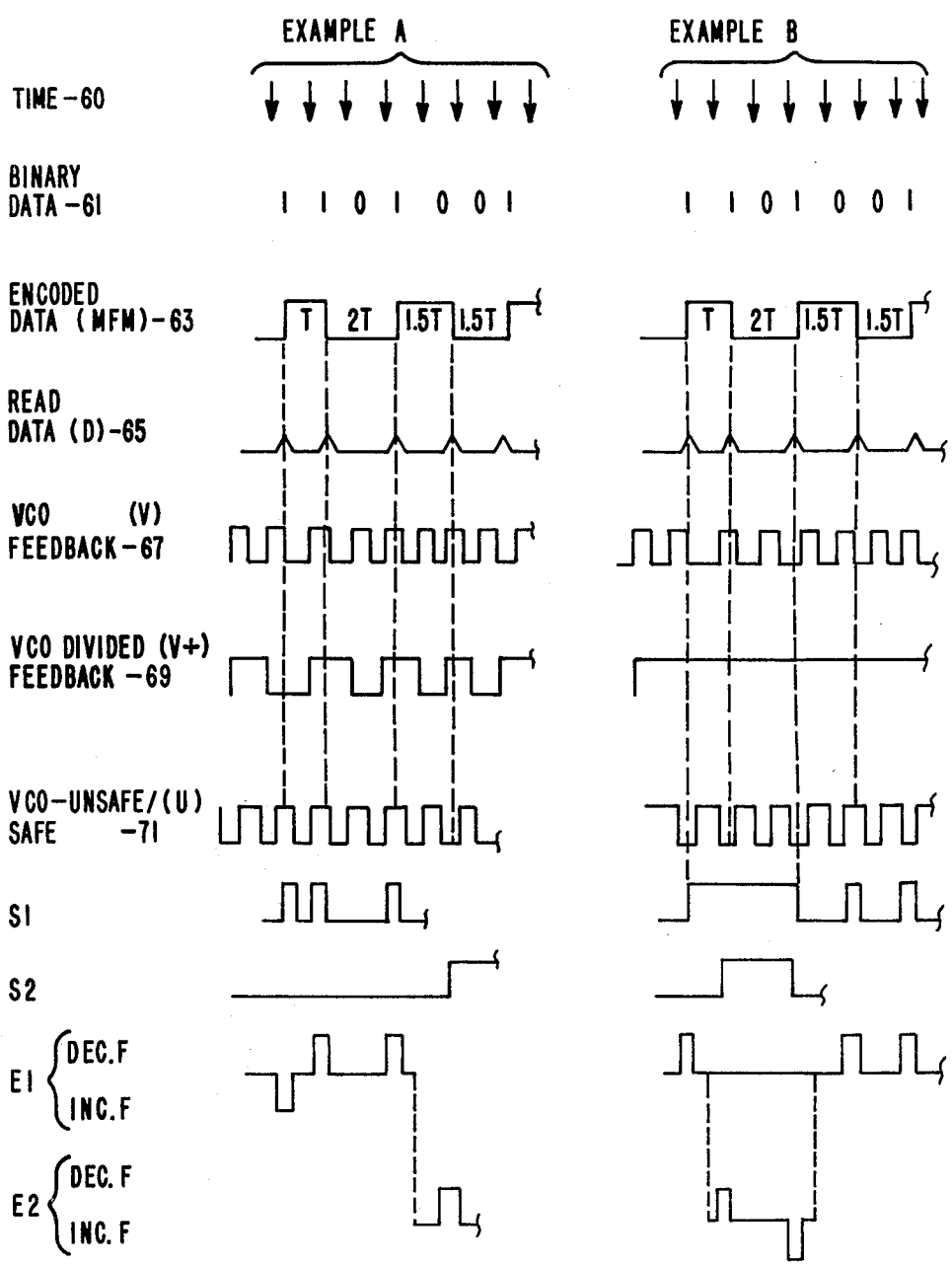
FIG. 2 is a timing diagram illustrating the operation of the circuit of FIG. 1.

With respect to FIG. 2, a string of binary numbers 61 is shown to be encoded in a typical encoding format, known as MFM, on a recording medium. In this format, pulses may have a pulse width of T, 1.5T or 2T, as shown by the pulse train 63. The electronics for reading data is able to detect transitions, indicative of the recorded ones and zeroes, as shown by the pulse stream 65. The occurrence of these pulses, relative to clock signals, such as the timing signals 60 indicate whether a data pulse 65 represents a one or a zero.

However the timing signals 60 represent the timing signals used for recording and not those to be used for reading data. The latter timing signals are derived in the present invention by synchronizing the voltage controlled oscillator (VCO) of the phase locked loop to the data itself using the circuit of FIG. 1. The VCO output is represented by the pulse train 67. Electronics associated with the VCO produce a VCO unsafe/safe signal 69 which provides "windows" indicating when the VCO should be near a zero crossing. This is of significance in the present invention because it indicates an error range. When a data pulse occurs outside of a window, i.e., when the VCO is unsafe, flip-flop 21 is immediately reset. However the brief output pulse from flip-flop 21 clocks flip-flop 43 of the first phase detector 41 whose inputs receive the VCO feedback signal V which may be stretched out by a divider 42. If the feedback signal is stretched the output of flip-flop 43 will expand the positive or negative duration of the signal generating error signal E1 in the frequency controller 61. The divided VCO signal is shown in the pulse train 69. The expanded polarity duration of the feedback signal forces a VCO frequency increase or decrease, one way or the other until a VCO window activates flip-flop 31 and the second phase detector 51. Whether there is an increase or decrease depends on whether the expanded feedback signal is in its high or low state at the time it is applied to flip-flop 43. The divider 42 which causes the VCO signal expansion may be a divide-by-two scaler, although division by other numbers is also possible. The input of flip-flop 43 may be viewed as a relatively wide band input signal which forces a rapid VCO pulse frequency coincidence with windows in the VCO unsafe/safe pulse train 71.

In example A in FIG. 2 the divided VCO pulse train is low at the time the first S1 pulse is generated by flip-flop 21. This causes the first error signal E1 to increase the VCO frequency. The next S1 pulse occurs because a VCO safe condition has not yet occurred, but the divided VCO pulse is high. This causes the first error signal E1 to decrease the VCO frequency in its search for a window in the unsafe/safe pulse train 71. During the next S1 pulse, the same conditions exist, but during the next data pulse, coincidence with a window is achieved, so that flip-flop 31 has a high Q output at node B, enabling the second phase detector 51 with an S2 pulse for producing a high Q output. Since the feedback pulse V is high at that time a second VCO error signal E2, decreasing the VCO frequency is generated. This signal is less likely to move the VCO feedback signal V out of the newly found window because of the higher error clocking rate, namely at frequency V, compared to the divided VCO frequency which is an input to the first phase detector. An advantage of using a divided VCO as an input to flip-flop 43 is that a relatively wide range of data frequencies can be locked up by the loop.

In example B of FIG. 2, the VCO safe/unsafe signal 71 is initially safe thereby allowing rapid production of S2 pulses, since flip-flop 21 is not immmediately reset. These S2 pulses are productive of E2 error signals until the window in the VCO unsafe/safe pulse train is lost and S1 signals are again used for synchronization. Note that the divided VCO signal is a low frequency signal for locking onto a wide range of data frequencies. In example A, the divided VCO signal was divided by two, but that is not necessary, as seen from example B.

The error signals E1 and E2 are pulses used at terminals 63 and 65 to decrease and increase the VCO frequency thereby bringing the VCO into synchronization with data being read.

What is claimed is:

1. In a digital phase locked loop of the type having a voltage controlled oscillator (VCO) receiving input data and error signals from a phase comparator, and producing a VCO masking signal for noise reduction, as well as a VCO feedback signal, a phase comparator comprising, a first phase detector means for producing first order approximation error signals for increasing or decreasing the frequency of a VCO upon comparison of a VCO feedback and a data signal, a second phase detector means for producing second order approximation error signals for increasing or decreasing the frequency of a VCO upon comparison of a VCO feedback and a data signal, and logic means operatively associated with said first and second phase detector means and connected to receive a VCO masking signal indicating a VCO safe or unsafe condition, said logic means for activating said first phase detector means for a VCO unsafe condition and for activating said second phase detector means for a VCO safe condition, said first and second phase detector means activated upon timewise overlap between data and VCO feedback signals.

2. The phase comparator of claim 1 wherein said logic means comprises a sync detector having inputs connected to receive input data, VCO feedback signals, and VCO masking signals indicating a VCO safe or unsafe condition, said sync detector responding to data and VCO feedback signals having timewise overlap by generating first and second detector signals depending on whether said overlap occurs during a VCO unsafe or safe condition, respectively, said detector signals generated at first and second sync detector outputs, said first sync detector output connected to said first phase detector means, said second sync detector output connected to said second phase detector means.

3. The phase comparator of claim 2 wherein said logic means is further defined by gate means connected to receive said first and second error signals from said first and second phase detector means for gating said error signals toward the VCO.

4. The phase comparator of claim 3 wherein said gate means comprises a pair of OR gates both connected to said first and second phase detector means, including a first OR gate connected to receive signals for decreasing the VCO frequency and a second OR gate connected to receive signals for increasing the VCO frequency.

5. A phase comparator in a digital phase locked loop of the type receiving a discriminated data signal, a VCO masking signal indicating a VCO safe or unsafe condition, and a VCO feedback signal, said comparator for phase comparison between the data and VCO feedback signals comprising, sync detector means having first and second outputs and having inputs receiving a discriminated data signal, a VCO masking signal indicating VCO safe and unsafe conditions and a VCO feedback signal, said sync detector means for responding to data and VCO feedback signals having timewise overlap, wherein the response is a first detector signal generated at said first output for timewise overlap occurring during a VCO unsafe condition and a second detector signal generated at said second output, during a VCO safe condition, a first phase detector means connected to said first sync detector output thereby receiving the first detector signal and to an input associated with the divider for providing a divided VCO feedback signal, said first phase detector means for producing a first order approximation error signal for increasing or decreasing the VCO frequency during the VCO unsafe condition, a second phase detector means connected to said second sync detector output thereby receiving the second detector signal and to an input for receiving said VCO feedback signal, said second phase detector means for producing a second order approximation error signal for increasing or decreasing the VCO frequency during the VCO safe condition, and gate means connected to receive said first and second error signals from said first and second phase detector means for gating said error signals toward the VCO.

6. The phase comparator of claim 5 wherein said sync detector includes a first flip-flop connected to receive the discriminated data signal and the VCO feedback signal for signalling timewise overlap of said signals, with a first sync signal, and means responsive to the VCO masking signal for combining the first sync signal with the masking signal to produce the first detector signal, and clearing the first flip-flop during a VCO unsafe condition, and a second flip-flop connected to receive said first sync signal and the VCO feedback signal for signalling timewise overlap of said signals by means of the second detector signal.

7. The apparatus of claim 6 wherein said data occurs at a harmonic frequency and the frequency divider is adapted to divide the VCO output by a number yielding a non-harmonic frequency.

8. The apparatus of claim 5 wherein said gate means comprises a pair of OR gates both connected to said first and second phase detector means, including a first OR gate connected to receive signals for decreasing the VCO frequency and a second OR gate connected to receive signals for increasing the VCO frequency.

* * * * *

UNITED STATES PATENT AND TRADEMARK OFFICE
CERTIFICATE OF CORRECTION

PATENT NO. : 4,200,845
DATED : April 29, 1980
INVENTOR(S) : Charles E. Mendenhall and Randall L. Sandusky It is certified that error appears in the above-identified patent and that said Letters Patent are hereby corrected as shown below:

Col. 6, line 57: delete "the" and insert in place thereof - -a- -

Col. 8, line 4: delete "of claim 6" and insert in place thereof - -of claim 5- -

Signed and Sealed this

Eleventh Day of August 1981

[SEAL]

Attest:

GERALD J. MOSSINGHOFF

Attesting Officer        Commissioner of Patents and Trademarks